United States Patent [19]

Horiba et al.

[11] Patent Number: 4,804,848
[45] Date of Patent: Feb. 14, 1989

[54] IONIZING RADIATION DETECTOR FOR DETECTING THE DIRECTION AND INTENSITY OF THE RADIATION

[75] Inventors: Yasutaka Horiba; Masao Nakaya; Yuto Ikea, all of Itami, Japan

[73] Assignee: Mitsubishi Denki Kabushiki Kaisha, Tokyo, Japan

[21] Appl. No.: 28,139

[22] Filed: Mar. 19, 1987

[30] Foreign Application Priority Data

Mar. 19, 1986 [JP] Japan .................................. 61-62036

[51] Int. Cl.$^4$ ............................................... G01T 1/22
[52] U.S. Cl. ................................. 250/394; 250/370.01
[58] Field of Search .......... 250/370 R, 370 H, 370 A, 250/385, 394

[56] References Cited

U.S. PATENT DOCUMENTS

| | | | |
|---|---|---|---|
| 3,564,245 | 2/1971 | Koehler | 250/370 R |
| 3,624,399 | 11/1971 | Boer et al. | 250/370 H |
| 3,715,590 | 2/1973 | Auer | 250/394 X |
| 3,934,143 | 1/1976 | Prag | 250/370 H |

FOREIGN PATENT DOCUMENTS

| | | | |
|---|---|---|---|
| 0167119 | 1/1986 | European Pat. Off. | 250/370 R |
| 3441498 | 5/1986 | Fed. Rep. of Germany | 350/370 H |

OTHER PUBLICATIONS

"Statistical Measurement of α-Particle Induced Minority Carriers", by Yuto Ikeda, Kazutami Arimoto, Michihiro Yamada, Takao Nakano, Lecturee No. 483, Comprehensive National Conf. of Electronics and Communication Society of Japan, 1986.
"Measurement of Collection Efficiency of α-Particle Induced Minority Carriers in Hi-C Structure", by Hiroki Shimano, Katsuhiro Tsukamoto, Takeyuki Matsukawa, Preparing of Spring Meeting, Jpn. Soc. Appl. Phys. (1986), p. 546.
"Comparison of d-Particle Induced Charge Collection on MOS Capacitors Using a DC Tester", by Phil Oldiges et al., Extended Abstracts of the 17th Conference on Solid State Devices and Materials, pp. 33 to 36, 1985.
"Charge Collection Measurements for Energetic Ions in Silicon", by A. B. Campbell et al., IE$^3$ Trans. on Nuclear Science, vol. NS-29, No. 6, 1982.

Primary Examiner—Gene Wan
Attorney, Agent, or Firm—Birch, Stewart, Kolasch & Birch

[57] ABSTRACT

A detector for detecting the direction of incidence of ionized radiation comprises a laminated structure radiation detector which includes a plurality of planar structure detectors, each detector having a planar structure detector means constructed of a plurality of unit detectors arranged regularly on a plane and responsive to the ionized radiation. The planar detector further has position detector means which detects the position of the unit detector which has responded to ionized radiation. These planar structure detectors are arranged with a predetermined distance between them. The radiation detector further comprises direction of incidence calculating means for obtaining the direction of incidence of the ionized radiation from the outputs of the respective position detectors of the respective planar structure detectors.

9 Claims, 2 Drawing Sheets

IONIZING RADIATION DETECTOR FOR DETECTING THE DIRECTION AND INTENSITY OF THE RADIATION

FIELD OF THE INVENTION

The present invention relates to an ionized radiation detector for measuring the direction of incidence of the ionized radiation.

BACKGROUND ART

FIG. 2 shows a device for detecting ionizing radiation such as α rays reported in an Lecture No. 483 the National Conference of Electronics and Communication Society of 1986. In FIG. 2, reference numeral 1 designates a p type semiconductor substrate, reference numeral 2 designates an n-type region (n+ region) provided in the p type semiconductor substrate 1. Reference numeral 3 designates a precharge transistor for electrostatically precharging the n-type region 2 to a positive voltage with the gate voltage being controlled by a signal input to a terminal 31. Reference numeral 4 designates a detection buffer for outputting impedance converted voltage of representing the voltage variation detected at the n type region 2. The terminal 11 of the p-type substrate 1 is biased with a negative voltage with relative to the source voltage of the precharged transistor 3 or the positive power supply voltage 42 of the detection buffer.

This ionized radiation detector operates as follows:

At first, when α rays are incident to the n+ region 2 of the radiation detector, as shown by an arrow A, electron-hole pairs are generated and excited by the radiation energy on the incident region. When the n-type region 2 is charged with a positive voltage relative to the p-type substrate 1 by the precharge transistor 3, the p-n junction 12 is reverse biased, and the electrons of the excited electron-hole pairs towards the n-type region 2 to counteract the positive charges of that region, thereby lowering the voltage of the n type region 2. This lowering of the voltage is impedance converted by the detection buffer 4 and outputted to the output terminal 41. The n type region 2 is again precharged by the precharge transistor 3 to a positive voltage during a predetermined period to prepare provides for the next incidence of α rays.

In the above described operation, the number of generated electron-hole pairs varies depending on the rays angle of α incidence, and as a result, electron currents flowing through the n type region 2 also vary. In such a case, the radiation detector outputs a voltage in accordance with the direction of incidence. This voltage also varies dependent on the variation of the energy of the incident radiation, thereby rendering impossible to determine the direction of incident from the amplitude of the output voltage.

The use of the prior art ionizing radiation detector, which uses the above described detector to detect the direction of incidence, must determine whether the detector has directionality as part of its sensitivity. If the detector has directionality, the user must find the direction of incidence, or if the detector does not have directionality, the user must provide a collimator on the front surface of the detector. Furthermore, to obtain the direction of incidence it is necessary to determine the direction of the maximum intensity by conducting a number of times the measurement of putting the detector in various directions. Furthermore, it is impossible to use this method. When the intensity of the incident ionized radiation varies with the passage of time because the detected output will change due to intensity variation during the many measurements.

SUMMARY OF THE INVENTION

An objective of the present invention is to provide an improved ionized radiation detector capable of detecting the direction of incidence of the ionized radiation and also capable of conducting high precision detection at even when there are variations in the intensity of the radiation over the passage of time.

Other objectives and advantages of the present invention will become apparent from the detailed description given below: however it should be understood that the detailed description and specific embodiment are given by way of illustration only, since various changes and modifications within the spirit and scope of the invention will become apparent to those skilled in the art from this detailed description.

According to the present invention, there is provided a detector for determining the direction of incidence of the ionized radiation, which comprises a laminated structure radiation detector having a plurality of planar structure detectors. Each planar detector comprises a planar structure detector means having a plurality of unit detectors which are arranged regularly on a plane and respond to the ionizing radiation and a position detect means which detects the position of said unit detector which has responded to incident radiation. The planar structure detectors are arranged to have a predetermined distance between them. The radiation detector further comprises direction of incidence calculator means for obtaining the direction of incidence of said ionized radiation from the outputs of said respective position detectors of said respective planar structure detectors.

DETAILED DESCRIPTION OF THE PREFERRED EMBODIMENTS

To explain the present invention in detail, reference will be made to FIG. 1.

Figure 1:
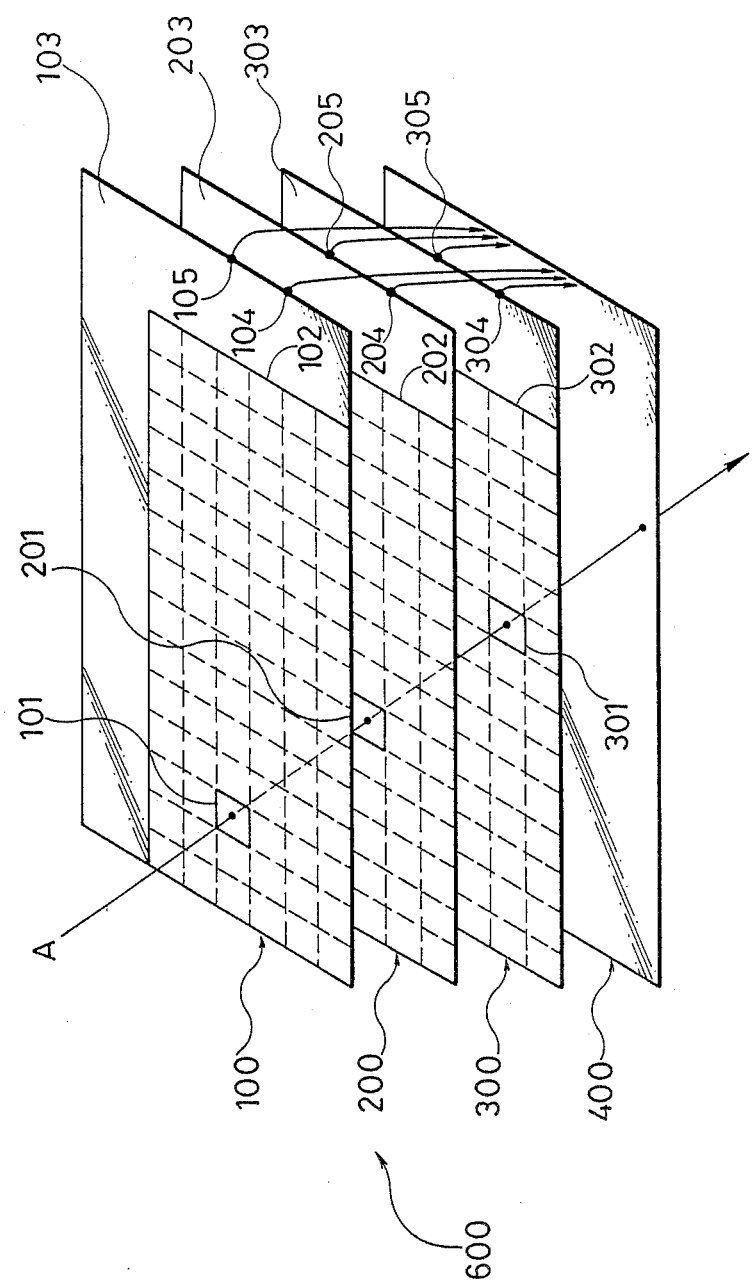
FIG. 1 is a perspective view of one embodiment of the ionized radiation detector according to the present invention.
Figure 2:
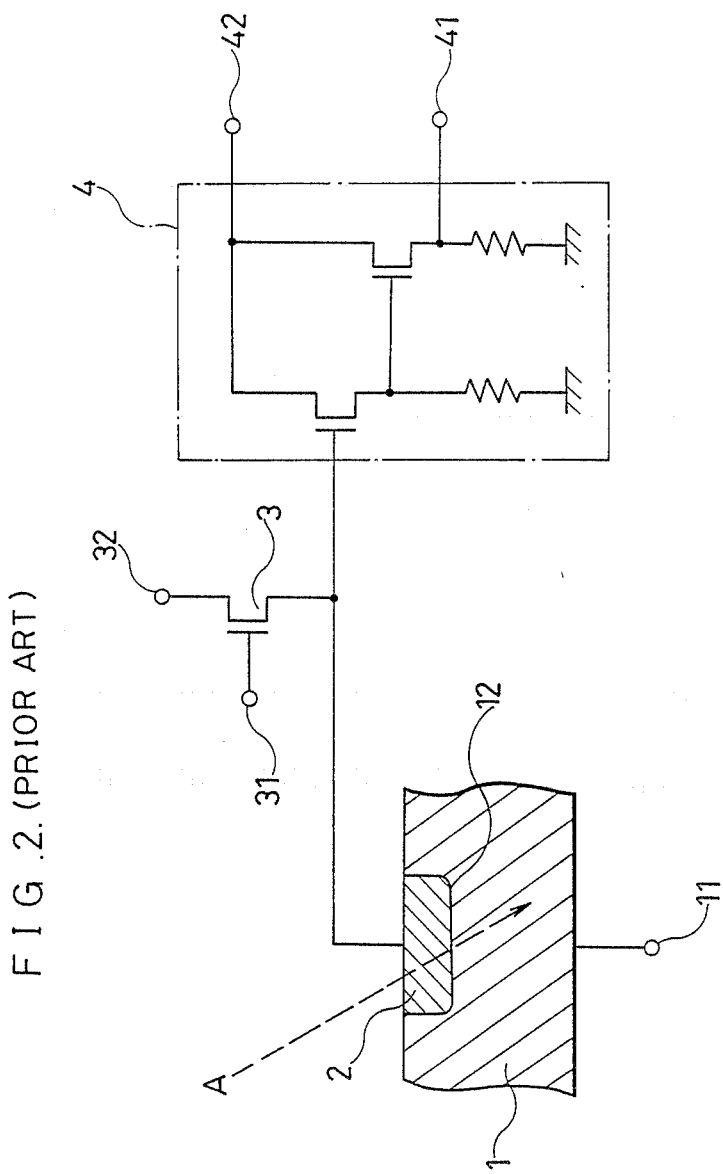
FIG. 2 is a perspective view of the prior art ionized radiation detector.

In FIG. 1, reference numeral 101 designates a detector cell as a unit detector; reference numeral 100 designates a planar structure radiation detector obtained by regularly arranging the detector cells 101 in a two dimensional array; reference numeral 102 designates a regularly arranged detector cell region; and reference numeral 103 designates a position detector for detecting the positions of the cells through which the radiation has incidented upon and being provided at the periphery of the region 102. Reference numerals 200 and 300 designate planar structure radiation detectors having the same structure as the planar structure radiation detector 100. The planar structure radiation detectors are laminated with each other and are apart from each other by a predetermined distance.

Reference numeral 400 designates a direction incidence calculation circuit for obtaining the direction of incidence of the radiation from the radiation affected positions. The affected positions are communicated to the calculating circuit from the respective position detector circuits 103, 203, 303 in the respective planar structure detectors. This direction of incidence calculation circuit 400 is provided in a plane which is laminated with the planar structure radiation detector planes 100, 200, and 300. The position detector circuits 103, 203, 303 and the direction in incidence calculating circuit 400 are designed to have low sensitivity to the radiation so as to be unaffected by radiation.

The above described planar structure radiation detectors 100, 200, 300 are constructed using ordinary dynamic RAMS. The detectors include flatly arranged memory cells, operating as unit detectors, and decoders and sense amplifiers, operating as position detectors by reading out the contents of the memory cells. Furthermore, a laminated structure radiation detector 600 is constructed by laminating the surface structure radiation detectors 100, 200, and 300 on a semiconductor substrate with insulating films inserted between them.

The operation of this device is as follows.

When upon radiation is incident to the unit detector cell 101 in the most upper planar structure radiation detector layer 100 in the direction designated by arrow A, unit detector cell 101 responds to the radiation, and its position $(x_1, y_1)$ is outputted from the position detector circuit 103. After the radiation has penetrated the most upper layer 100 which is thin, it is incident upon the unit detector cell 201 in the second layer 200. The unit detector cell 201 responds to the radiation, and its position $(x_2, y_2)$ is outputted from the position detector circuit 202. Similarly as described above position information $(x_3, y_3)$ is outputted from the position detector 302.

The outputs $(x_1, y_1)$ to $(x_3, y_3)$ of the respective planar structure layers are outputted from the position detector circuits as outputs 104, 105, 204, 205, 304, and 305, to the direction of incidence calculating circuit 400. This circuit 400 calculates the direction of incidence of the radiation from the outputs $(x_1, y_1)$ to $(x_3, y_3)$. For example, when $x_1=x_2=x_3$ and $y_1=y_2=y_3$ the radiation is found to have a vertical direction with respect to the surface of the laminated structure. Furthermore, when $x_1=x_2=x_3$ and $y_1 \neq y_2$ or $y_2 \neq y_3$ the radiation is found to have come from a surface which is at a non-perpendicular angle with respect to the laminated surface, and the incident angle is calculated from $y_1$, $y_2$ and $y_3$.

When using a dynamic RAM, it does not always follow that only the memory cell will respond to the radiation. The bit line or word line may also respond to the radiation, dependent on the structure. This means that the radiation incident position (x, y) can be determined by arranging two dynamic RAM layers such that the radiation responding lines comprising either the bit line or word line, are arranged vertical with each other. This arrangement of a the two layers constitute a planar structure radiation detector which operates similarly to the operation described above.

Furthermore, the radiation incident upon a cell may influence not only that cell but also the other cells in the same plane. In such a case the incident position (x, y) can be detected only in the form of distribution intensity. When using the form of distributing intensity, the direction of incidence can be obtained by a device using a calculation function for obtaining such distribution functions.

In the above illustrated embodiment, a dynamic RAM is used as a planar structure detector, however planar structure detectors can also be constructed of a static RAM, CCD, or PLA.

In the above illustrated embodiment, three layers of planar structure radiation detectors are employed, but principally, only two layers are needed to accomplish the objective of the invention. Furthermore, if the number of detector cells included in the planar structure radiation detector or the number of layers of the planar structure radiation detectors are increased, the precision of the detection can be enhanced.

Furthermore, it is also possible to obtain the energy of the radiation by combining the value of the output of each layer with the calculated result of the direction of incidence by using a device which has a greater thickness due to an increased number of the layers of the planar structure radiation detectors or an increased distance provided between the layers.

The method employed in the above described ionized radiation detector can be also utilized in detecting the incident direction of a slender beam shape infrared rays by replacing the detector cells of each planar structure with circuits sensitive to infrared rays.

As is evident from the foregoing description, according to the present invention, a device for detecting the radiation is constituted by a plurality of planar structure radiation detectors laminated with each other. Thus, the need to measure the direction of incidence a number of times when using the conventional device having directionality by putting the device in various directions to obtain the maximum direction is nullified. The present invention has made it possible to conduct the direction measurement in a short time and with high precision. Furthermore, the present invention has made it possible to conduct the measurement even when the quantity of the incident ionized radiation varies with the passage of time.

What is claimed is:

1. A detector for detecting a direction of incidence of ionized radiation comprising:
   a laminated structure radiation detector, said laminated structure radiation including a plurality of planar structure detectors, each of said planar structure detectors including,
      planar structure detector means for responding to the ionized radiation, said planar structure detector means being a plurality of unit detectors regularly arranged on the planar structure, said unit detectors being responsive to the ionized radiation, and
      position detector means for detecting a position of said unit detector which has responded to the ionized radiation and outputting a value representing said position;
   said planar structure detectors having a predetermined distance therebetween; and
   direction of incidence calculating means, responsive to said laminated structure radiation detector, for obtaining the direction of incidence of the ionized radiation from said value outputted from said position detector means.

2. The detector as claimed in claim 1, wherein said planar structure detector means comprises dynamic RAM, said dynamic RAM representing said unit detectors.

3. The detector as claimed in claim 1, wherein said direction of incidence calculating means determines an energy intensity of the ionized radiation.

4. The detector as claimed in claim 2, wherein said unit detectors are arranged to form data lines on said planar structure detectors, said data lines being vertically above each other with no offset.

5. A detector, having a laminated structure, for detecting a direction of incidence and an energy intensity of ionized radiation comprising:
- a planar detecting means for detecting the ionized radiation; and calculating means, operatively connected to said planar detecting means, for determining the direction of incidence and energy intensity of the ionized radiation;
- said planar detecting means including,
  - unit detectors, regularly arranged in a two-dimensional pattern, being responsive to the ionized radiation, and
  - position detecting means, operatively connected to said unit detectors, for detecting a position of said unit detector which has responded to the ionized radiation and outputting a value representing said position to said calculating means, said position detecting means measuring said position as x and y coordinates.

6. The detector as claimed in claim 5, wherein said unit detectors comprise dynamic RAM.

7. The detector as claimed in claim 6, wherein said unit detectors measure directly charge quantities of electron-hole pairs, said electron hole pairs being produced in said dynamic RAM in response to the ionized radiation.

8. The detector as claimed in claim 5 further comprises:
- switching means, operatively connected to said planar detecting means and said calculating means, for controlling the outputting of said values of said position detecting means to said calculating means, thereby enabling said planar detecting means to specify to said calculating means which unit detector responded to the ionized radiation.

9. The detector as claimed in claim 5 further comprises no metal grids.

* * * * *